(12) United States Patent
Schmer et al.

(10) Patent No.: US 12,708,033 B2
(45) Date of Patent: Aug. 11, 2026

(54) POWER SEMICONDUCTOR MODULE ARRANGEMENT AND METHOD FOR ASSEMBLING THE SAME

(71) Applicant: Infineon Technologies AG, Neubiberg (DE)

(72) Inventors: Alexander Schmer, Soest (DE); Markus Stein, Soest (DE)

(73) Assignee: Infineon Technologies AG, Neubiberg (DE)

( * ) Notice: Subject to any disclaimer, the term of this patent is extended or adjusted under 35 U.S.C. 154(b) by 377 days.

(21) Appl. No.: 18/504,463

(22) Filed: Nov. 8, 2023

(65) Prior Publication Data

US 2024/0162099 A1 May 16, 2024

(30) Foreign Application Priority Data

Nov. 16, 2022 (EP) .................................... 22207914

(51) Int. Cl.
*H10W 76/15* (2026.01)
*H10W 76/01* (2026.01)

(52) U.S. Cl.
CPC ........... *H10W 76/15* (2026.01); *H10W 76/01* (2026.01)

(58) Field of Classification Search
CPC ... H10W 76/15; H10W 76/13; H10W 76/136; H10W 76/153; H10W 76/165
See application file for complete search history.

(56) References Cited

U.S. PATENT DOCUMENTS 5,564,954 A * 10/1996 Wurster ............... H01R 12/585 439/82
6,619,999 B2 * 9/2003 Bright .................... H05K 3/368 439/943
7,377,823 B2 * 5/2008 Chen .................... H01R 12/585 439/82
7,780,483 B1 * 8/2010 Ravlich ................ H01R 12/585 439/82
9,906,157 B2 * 2/2018 Tan ....................... H01L 23/053
10,044,121 B2 * 8/2018 Shimizu ............... H01R 12/585
10,825,748 B2 * 11/2020 Yao ....................... H01L 23/053
2009/0104734 A1 * 4/2009 Specht ................ H01L 21/4817 438/117

(Continued)

FOREIGN PATENT DOCUMENTS

EP 3644358 A1 4/2020

*Primary Examiner* — Bac H Au
(74) *Attorney, Agent, or Firm* — Murphy, Bilak & Homiller, PLLC

(57) ABSTRACT

A power semiconductor module arrangement includes: a housing having a plurality of through holes; a substrate forming a ground surface of the housing; and a plurality of terminal elements mechanically and electrically connected to the substrate. A first end of each terminal element is arranged inside the housing and connected to the substrate. Each terminal element extends from the substrate in a vertical direction perpendicular to a top surface of the substrate through one of the through holes to the outside of the housing, such that a second end of each terminal element is arranged outside of the housing. Each terminal element includes a holding element arranged between the first end and the second end. Each holding element exerts a force on the housing, thereby holding the housing in a desired position with regard to the substrate.

14 Claims, 6 Drawing Sheets

(56) References Cited

U.S. PATENT DOCUMENTS

| | | | | |
|---|---|---|---|---|
| 2009/0197439 | A1* | 8/2009 | Nabilek | H01R 12/585 439/825 |
| 2012/0295490 | A1* | 11/2012 | Schneider | H01R 12/91 29/423 |
| 2014/0199861 | A1 | 7/2014 | Mattiuzzo | |
| 2018/0033711 | A1* | 2/2018 | Hartung | H01L 25/072 |
| 2021/0305144 | A1* | 9/2021 | Nogawa | H01L 23/562 |
| 2022/0093486 | A1 | 3/2022 | Reiter et al. | |
| 2024/0153832 | A1* | 5/2024 | Stein | H01L 23/053 |

* cited by examiner 42
100
72
46
44
7
4
y
62
41
x
10

42
100
46
7
44
72
4
62
41
y
z
10
x 4
46
72
44
F F
y
7
x

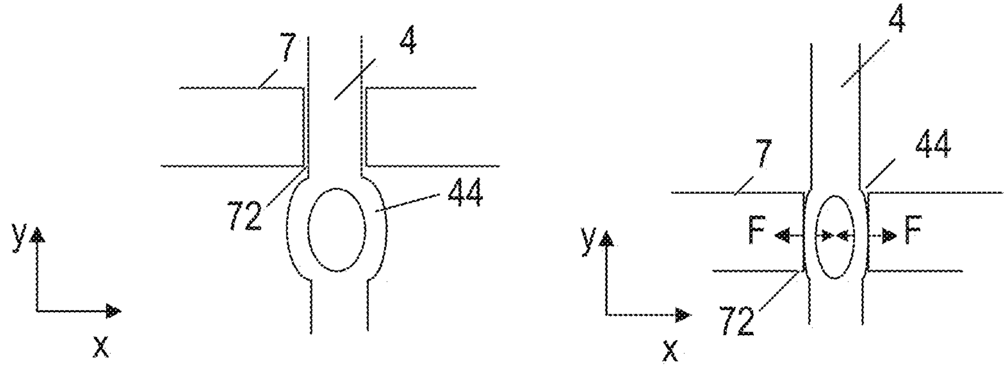
FIG 12A
FIG 12B
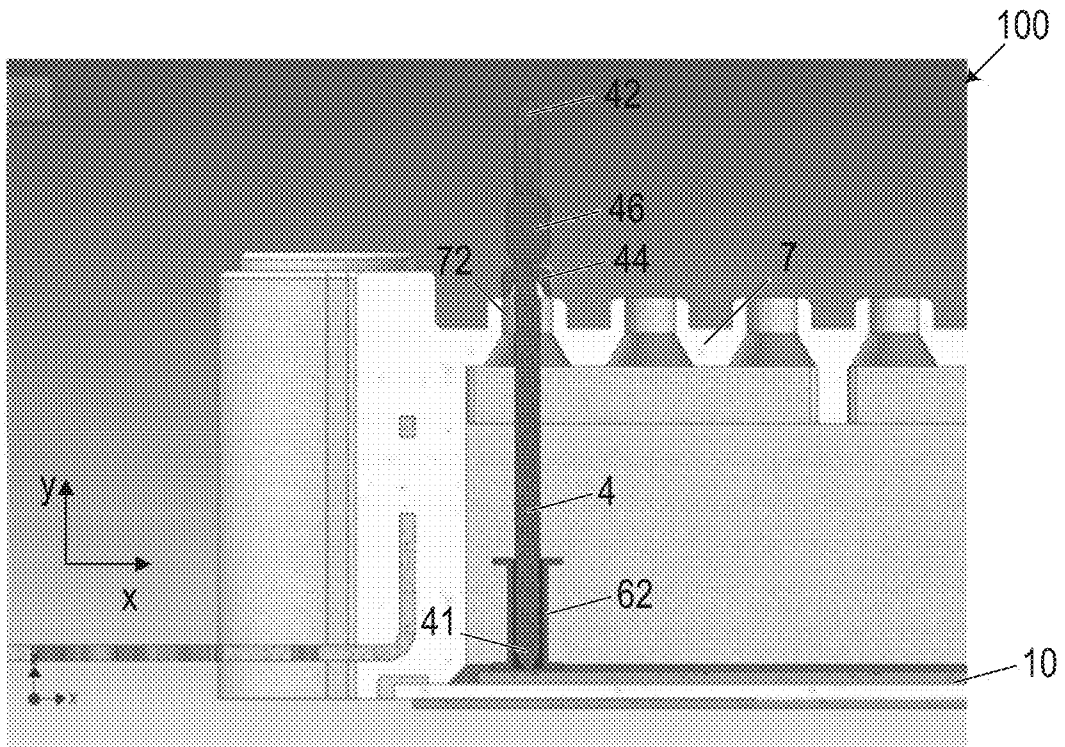
FIG 13

42
46
72
44
7
4
41
10
y
x 42
46
44
4
41
y
z
x 72
42
46
44
7
y
x
z 42
46
72
44
7
4
41
10
y
x 42
46
44
4
41
y
z
x 42
46
7
44
72
y
x
z

POWER SEMICONDUCTOR MODULE ARRANGEMENT AND METHOD FOR ASSEMBLING THE SAME

TECHNICAL FIELD

The instant disclosure relates to a power semiconductor module arrangement, in particular to a power semiconductor module arrangement comprising a housing, and to a method for assembling the same.

BACKGROUND

Power semiconductor module arrangements often include a substrate within a housing. The substrate usually comprises a substrate layer (e.g., a ceramic layer), a first metallization layer deposited on a first side of the substrate layer and, optionally, a second metallization layer deposited on a second side of the substrate layer. A semiconductor arrangement including one or more controllable semiconductor elements (e.g., two IGBTs in a half-bridge configuration) may be arranged on the substrate. One or more terminal elements (contact elements), which allow for contacting such a semiconductor arrangement from outside the housing, are usually provided. Power semiconductor modules are known, where the terminal elements are arranged on the substrate and protrude in a direction that is essentially perpendicular to the main surface of the substrate through a cover of the housing. The section of the contact elements which protrudes out of the housing may be mechanically and electrically coupled to a printed circuit board. The housing may be glued to the substrate in order to remain in a desired position until the substrate is permanently attached to a base plate or heat sink by means of additional connecting elements. Gluing the housing to the substrate requires additional pretreatment steps (e.g., a plasma treatment of the substrate), a step in which the glue is applied to the substrate, as well as a hardening step in which the originally viscous glue is hardened, thereby attaching the housing to the substrate. Each additional step during the assembly process requires additional process time and increases the overall cost of the power semiconductor module arrangement.

There is a need for a power semiconductor module arrangement that may be assembled in an effective and cost-efficient way.

SUMMARY

A power semiconductor module arrangement includes a housing including a plurality of through holes, a substrate forming a ground surface of the housing, and a plurality of terminal elements mechanically and electrically connected to the substrate, wherein a first end of each of the plurality of terminal elements is arranged inside the housing and connected to the substrate, each of the plurality of terminal elements extends from the substrate in a vertical direction perpendicular to a top surface of the substrate through one of the plurality of through holes to the outside of the housing such that a second end of each of the plurality of terminal elements is arranged outside of the housing, each of the plurality of terminal elements includes a holding element arranged between the first end and the second end, and each of the plurality of holding elements exerts a force on the housing, thereby holding the housing in a desired position with regard to the substrate.

A method for assembling a power semiconductor module arrangement includes connecting a plurality of terminal elements to a substrate, and arranging a housing including a plurality of through holes on the substrate, wherein each of the plurality of terminal elements extends from the substrate in a vertical direction perpendicular to a top surface of the substrate, arranging the housing on the substrate includes inserting each of the plurality of terminal elements into a different one of the plurality of through holes such that a first end of each of the plurality of terminal elements is arranged inside the housing and connected to the substrate, and a second end of each of the plurality of terminal elements is arranged outside of the housing, each of the plurality of terminal elements includes a holding element arranged between the first end and the second end, and after arranging the housing on the substrate, each of the plurality of holding elements exerts a force on the housing, thereby holding the housing in a desired position with regard to the substrate.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

BRIEF DESCRIPTION OF THE DRAWINGS

FIGS. 12A and 12B schematically illustrate the general principle of a holding element according to embodiments of the disclosure.

FIG. 13 is a cross-sectional view of a section of a power semiconductor module according to an even further example.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". A semiconductor body as described herein may be made from (doped) semiconductor material and may be a semiconductor chip or may be included in a semiconductor chip. A semiconductor body has electrically connecting pads and includes at least one semiconductor element with electrodes.

Figure 1:
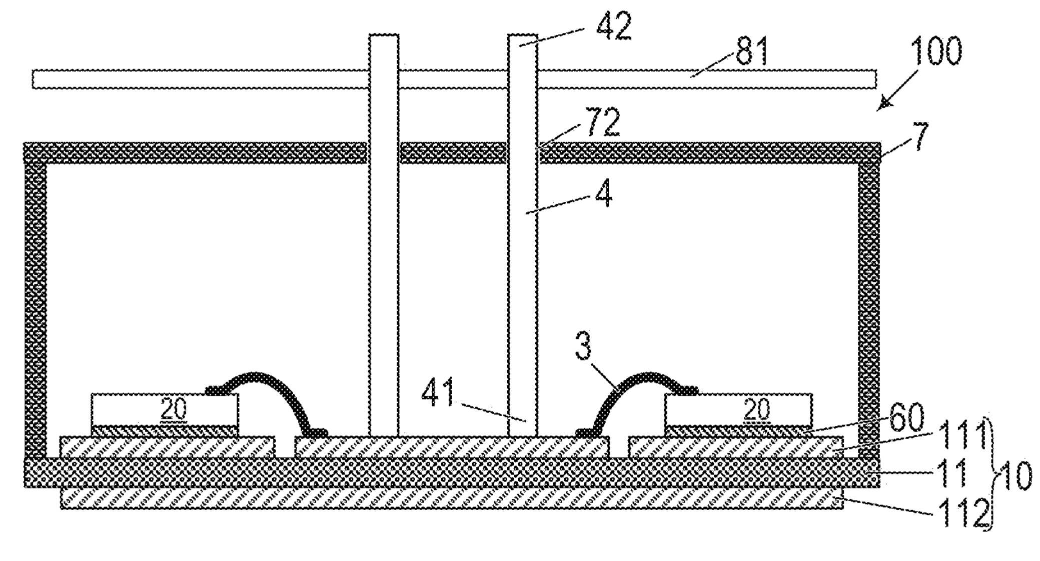
FIG. 1 is a cross-sectional view of a power semiconductor module arrangement.

Referring to FIG. 1, a cross-sectional view of a power semiconductor module arrangement 100 is illustrated. The power semiconductor module arrangement 100 includes a housing 7 and a substrate 10. The substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. Alternatively, the dielectric insulation layer 11 may consist of an organic compound and include one or more of the following materials: $Al_2O_3$, AlN, SiC, BeO, BN, or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $SiO_2$, $Al_2O_3$, AlN, SiN or BN and may have a diameter of between about 1 μm and about 50 μm. The substrate 10 may also be a conventional printed circuit board (PCB) having a non-ceramic dielectric insulation layer 11. For instance, a non-ceramic dielectric insulation layer 11 may consist of or include a cured resin.

The substrate 10 is arranged in a housing 7. In the example illustrated in FIG. 1, the substrate 10 forms a base surface of the housing 7, while the housing 7 itself solely comprises sidewalls and a cover. In some power semiconductor module arrangements 100, more than one substrate 10 is arranged within the same housing 7.

One or more semiconductor bodies 20 may be arranged on the at least one substrate 10. Each of the semiconductor bodies 20 arranged on the at least one substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable semiconductor element.

The one or more semiconductor bodies 20 may form a semiconductor arrangement on the substrate 10. In FIG. 1, only two semiconductor bodies 20 are exemplarily illustrated. The second metallization layer 112 of the substrate 10 in FIG. 1 is a continuous layer. According to another example, the second metallization layer 112 may be a structured layer. According to other examples, the second metallization layer 112 may be omitted altogether. The first metallization layer 111 is a structured layer in the example illustrated in FIG. 1. "Structured layer" in this context means that the respective metallization layer is not a continuous layer, but includes recesses between different sections of the layer. Such recesses are schematically illustrated in FIG. 1. The first metallization layer 111 in this example includes three different sections. Different semiconductor bodies 20 may be mounted to the same or to different sections of the first metallization layer 111. Different sections of the first metallization layer may have no electrical connection or may be electrically connected to one or more other sections using electrical connections 3 such as, e.g., bonding wires. Semiconductor bodies 20 may be electrically connected to each other or to the first metallization layer 111 using electrical connections 3, for example. Electrical connections 3, instead of bonding wires, may also include bonding ribbons, connection plates or conductor rails, for example, to name just a few examples. The one or more semiconductor bodies 20 may be electrically and mechanically connected to the substrate 10 by an electrically conductive connection layer 60. Such an electrically conductive connection layer 60 may be a solder layer, a layer of an electrically conductive adhesive, or a layer of a sintered metal powder, e.g., a sintered silver (Ag) powder, for example.

The power semiconductor module arrangement 100 illustrated in FIG. 1 further includes terminal elements 4. The terminal elements 4 are mechanically and electrically connected to the substrate 10 (e.g., to the first metallization layer 111) and provide an electrical connection between the inside and the outside of the housing 7. The terminal elements 4 may be mechanically and electrically connected to the first metallization layer 111 with a first end 41, while a second end 42 of the terminal elements 4 protrudes out of the housing 7. The terminal elements 4 may be electrically contacted from the outside at their second end 42. The housing 7 (i.e., the cover of the housing 7) comprises a plurality of through holes 72. Each of the plurality of terminal elements 4 protrudes vertically through a different one of the plurality of through holes 72.

In addition to the terminal elements 4 described with respect to FIG. 1, the components inside the housing 7 may also be electrically contacted from outside the housing 7 in any other suitable way. For example, additional terminal elements 4 may be arranged closer to or adjacent to the sidewalls of the housing 7. It is also possible that terminal elements 4 protrude vertically or horizontally through the sidewalls of the housing 7. The first end 41 of a terminal element 4 may be electrically and mechanically connected to the substrate 10 by an electrically conductive connection layer, for example (not explicitly illustrated in FIG. 1). Such an electrically conductive connection layer may be a solder layer, a layer of an electrically conductive adhesive, or a layer of a sintered metal powder, e.g., a sintered silver (Ag) powder, for example. The first end 41 of a terminal element 4 may also be electrically coupled to the substrate 10 via one or more electrical connections 3, for example.

For example, the second ends 42 of the terminal elements 4 may be connected to a printed circuit board 81. In the example illustrated in FIG. 1, a printed circuit board 81 is arranged outside of the housing 7 and is arranged distant from and in parallel to the cover or lid of the housing 7 (and in parallel to the substrate 10). The printed circuit board 81 comprises a plurality of through holes, and each of the plurality of terminal elements 4 protrudes through a different one of the through holes. A plurality of components such as, e.g., semiconductor bodies, or any kind of active or passive components (not specifically illustrated in FIG. 1), may be arranged on an external printed circuit board 81. The terminal elements 4 electrically couple one or more components on the printed circuit board 81 to one or more of the components inside the housing 7. The external printed circuit board 81, however, is optional and may also be omitted.

A power semiconductor module arrangement as has been exemplarily described with respect to FIG. 1 above is usually assembled by a supplier of the power semiconductor arrangement and is subsequently shipped to a customer (usually without an external printed circuit board 81). At the customer, the power semiconductor module arrangement is usually arranged on an additional base plate or heat sink, for example. The housing 7 is attached to such a base plate or heat sink by means of dedicated connection elements, thereby also firmly attaching the housing 7 to the substrate 10. However, when shipping the assembled power semiconductor module arrangement 100, the housing 7 also needs to remain in a desired position with regard to the substrate 10, i.e., the housing 7 has to be secured to the substrate 10 in order to not fall off the substrate 10 until it is mounted to a base plate or heat sink.

Figures 2A, 2B, 2C:
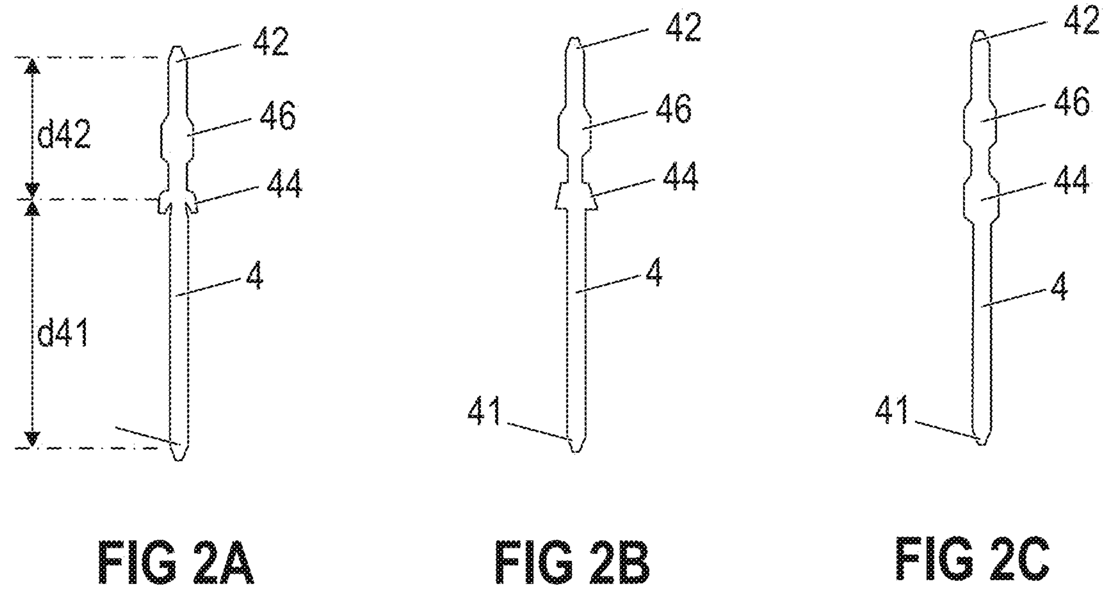
FIGS. 2A, 2B and 2C illustrate different exemplary terminal elements of a power semiconductor module arrangement.

Now referring to FIGS. 2A to 2C, exemplary terminal elements 4 of a power semiconductor module arrangement 100 are schematically illustrated. As has been described above, each terminal element 4 comprises a first end 41 and a second end 42. Each terminal element 4 according to embodiments of the disclosure further comprises a holding element 44 arranged between the first end 41 and the second end 42. A first distance d41 between the holding element 44 and the first end 41 of the terminal element 4 may be larger than a second distance d42 between the holding element 44 and the second end 42, for example. It is, however, also possible that the first distance d41 equals the second distance d42. Depending on the dimensions of the power semiconductor module arrangement 100, it is even possible that the second distance d42 is larger than the first distance d41. The holding element 44, however, is arranged distant from the second end 42 such that the second end 42 may be contacted from the outside of the housing 7, when the power semiconductor module arrangement 100 is assembled. That is, the second distance d42 may be 0.5 cm (centimeters) or more, 1 cm or more, or even 2 cm or more.

Figure 3:
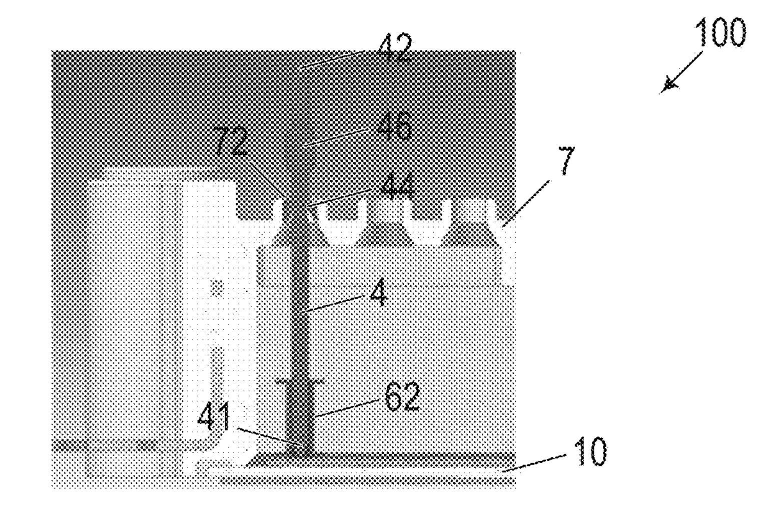
FIG. 3 is a cross-sectional view of a section of an exemplary power semiconductor module arrangement.
Figure 4:
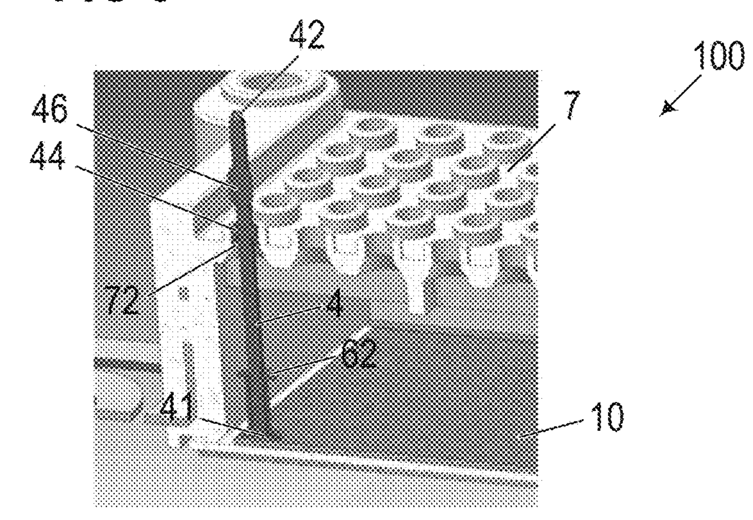
FIG. 4 is a three-dimensional cross-sectional view of the power semiconductor module arrangement of FIG. 3.
Figure 5:
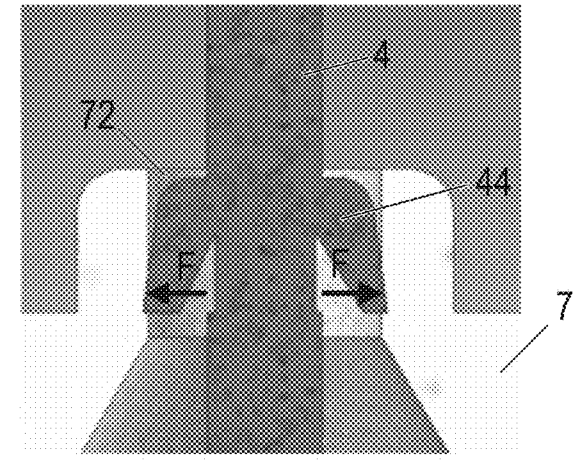
FIG. 5 is a cross-sectional view of a section of the power semiconductor module arrangement of FIG. 3.
Figure 5:
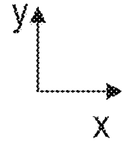

As has been described above, when the power semiconductor module arrangement 100 is fully assembled for shipping, each of the terminal elements 4 protrudes through a different one of the plurality of through holes 72 of the housing 7. When the power semiconductor module arrangement 100 is fully assembled for shipping, the holding element 44 may be arranged inside one of the through holes 72. This is exemplarily illustrated in FIGS. 3 to 11, wherein FIGS. 3, 4 and 5 schematically illustrate different views of a power semiconductor module arrangement comprising a terminal element 4 according to FIG. 2A, FIGS. 6, 7 and 8 schematically illustrate different views of a power semiconductor module arrangement comprising a terminal element 4 according to FIG. 2B, and FIGS. 9, 10 and 11 schematically illustrate different views of a power semiconductor module arrangement comprising a terminal element 4 according to FIG. 2C.

The holding element 44, when arranged inside one of the through holes 72, is configured to exert a force F on the housing 7 in a horizontal direction x that is perpendicular to the vertical direction y. This force F acts as a holding force, as it prevents the housing 7 from easily falling off the substrate 10. Generally, a force that is larger than the holding force F is required in order to remove the housing 7 from a holding element 44. A power semiconductor module arrangement 100, however, generally comprises a plurality of terminal elements 4 distributed over a cross-sectional area of the substrate 10. The exact number and positions of the terminal elements 4 generally depend on the individual design required for a specific application. The semiconductor bodies 20 and any other components, however, are usually distributed over the surface area of the substrate. The terminal elements 4 are required to provide control signals to the different semiconductor bodies 20, or other components arranged on the substrate 10. Different control signals usually are required for different components that are arranged at different positions on the substrate 10. The terminal elements 4, therefore, are usually arranged close to the components to which the respective control signals are to be provided. In this way, the housing 7 is held in place by means of a plurality of different terminal elements 4 and respective holding elements 44 distributed over a comparably large area, wherein each of the plurality of holding elements 44 exerts a certain force F on the housing 7.

The force exerted on the housing 7 by means of a plurality of holding elements 44 may not be enough to permanently fix the housing 7 to the substrate 10. When exposed to typical stress occurring during the operation of the power semiconductor module arrangement 100, the holding force exerted by the holding elements 44 may not be sufficient. The force, however, is generally sufficient to hold the housing 7 in a desired position with regard to the substrate 10 when shipping the power semiconductor module arrangement 100 to an end customer. When the power semiconductor module arrangement is arranged on an additional base plate or heat sink at the customer, which is usually the case, the housing 7 is usually fixed to the base plate or heat sink permanently by means of additional holding elements.

The holding elements 44 may be implemented in any suitable way. As is exemplarily illustrated in FIG. 2A, a holding element 44 may be or may comprise a spring element. When the holding element 44 is inserted into a through hole 72, the spring element may be compressed to a certain degree, if a diameter of the through hole 72 is smaller than a width or a diameter of the holding element 44 in an uncompressed state. The spring force counteracts the force compressing the spring element, thereby holding the housing 7 in its desired position. The spring element may be a press-fit element, for example, as is schematically illustrated in FIG. 2C.

The general principle of a spring element is illustrated in further detail in FIGS. 12A and 12B by means of a press-fit element. FIG. 12A schematically illustrates a holding element 44 implemented as a press-fit element and a corresponding counterpart (through hole 72) in a non-assembled state, and FIG. 12B schematically illustrates the press-fit element and the corresponding counterpart in an assembled state. While not connected to the counterpart (non-compressed state of the press-fit element), a press-fit element has a larger width (diameter) than its counterpart. The width of the press-fit element is a width in a horizontal direction x, z parallel to a top surface of the substrate 10. During the press-in process, the press-fit element is pushed into the counterpart. This results in a plastic deformation of the press-fit element (illustrated by means of the arrows in FIG. 12B). When inserted into the counterpart, the width of the press-fit element is reduced as compared to the non-compressed state. Only small insertion forces are generally necessary with high holding forces at the same time. The press-fit element and the counterpart, after inserting the press-fit element, are firmly attached to each other. The reduced width of the press-fit element results in a force F (spring force) which counteracts the compression of the press-fit element. The compressed holding element 44, therefore, may not be easily detached from the through hole 72. The same applies similarly for any other kind of spring elements.

Now referring to FIG. 2B, it is also possible that the holding element 44 is not compressed during the press-in process. That is, a largest width or diameter of the holding element 44 after inserting it into a through hole 72 may equal the largest width or diameter of the holding element 44 before the insertion. A largest width or diameter of the holding element 44 in this example may be equal to or slightly larger than a diameter of the corresponding through hole 72. For example, a largest width or diameter of the holding element 44 may be between 0 and 1 mm (millimeter), or between 0 and 2 mm larger than a diameter of the corresponding through hole 72. In this way, the holding element 44 may still be inserted into the through hole 72 when applying a certain amount of force. Once inserted into the through hole 72, however, the holding element 44 may not easily be detached again.

The holding element 44 in the example illustrated in FIG. 2B has a conical form. In particular, the width or diameter of the holding element 44 decreases from a side of the holding element 44 facing the first end 41 of the terminal element 4 towards an opposite side of the holding element 44 facing the second end 42 of the terminal element 4. The smallest width or diameter of the holding element 44 may be smaller than a diameter of the respective through hole 72. The side of the holding element 44 facing the second end 42 of the terminal element 4 may be inserted into the through hole 72 first. The holding element 44 may be pushed into the through hole 72, until the other side of the holding element 44 (the side of the holding element 44 having the largest width or diameter) is arranged inside the through hole 72. Inserting the holding element 44 into the through hole 72 with the smaller side first, allows to easily insert the holding element 44 into the through hole 72. The largest width or diameter of the holding element 44 is larger than a width or diameter of the terminal element 4. The holding element 44, therefore, forms a collar which acts as a barbed hook, once inserted into the through hole 72. The holding element 44, once inserted into the through hole 72, therefore may not be easily removed from the through hole 72 again. The implementations illustrated in FIGS. 2A to 2C, however, are only examples. The holding elements 44 generally may be implemented in any other suitable way.

A terminal element 4 may further comprise an additional press-fit element 46 arranged between the holding element 44 and the second end 42 of the terminal element 4. The additional press-fit element 46 may be inserted into one of a plurality of through holes of an external printed circuit board 81. For example, the additional press-fit element 46 of a terminal element 4 can be in contact with a conductor track (not specifically illustrated) of the printed circuit board 81. A plurality of conductor tracks is generally arranged on a printed circuit board 81. Conductor tracks can be arranged on a lower surface of the printed circuit board 81, or on a top surface of the printed circuit board 81, the lower surface being a surface facing the substrate 10 and the top surface being a surface facing away from the substrate 10. In this way, an electrical connection may be provided between the substrate 10 and the printed circuit board 81 via one or more terminal elements 4. The counterforces of a plurality of additional press-fit elements 46, which counteract the deformation of the additional press-fit elements 46 are generally sufficient in order to hold the printed circuit board 81 in a desired position.

Now referring to FIGS. 3, 4 and 5, sections of a power semiconductor module arrangement 100 in which a terminal element 4 according to FIG. 2A is arranged are schematically illustrated. In the figures, only one terminal element 4 is exemplarily illustrated to picture the general principle of the holding elements 44. In the example illustrated in FIGS. 3 to 5, the terminal element 4 is not mounted to the substrate 10 by means of an electrically conductive connection layer, but is inserted into a sleeve or rivet 62 instead. The sleeve or rivet 62 may be mounted to the substrate 10 by means of an electrically conductive connection layer, for example. Such an electrically conductive connection layer may be a solder layer, a layer of an electrically conductive adhesive, a welding seam, or a layer of a sintered metal powder, e.g., a sintered silver (Ag) powder, for example. The terminal element 4 can have the form of a pin at its first end 41 which points towards the substrate 10 and therefore can be easily inserted into the sleeve or rivet 62.

Figures 6, 7, 8:
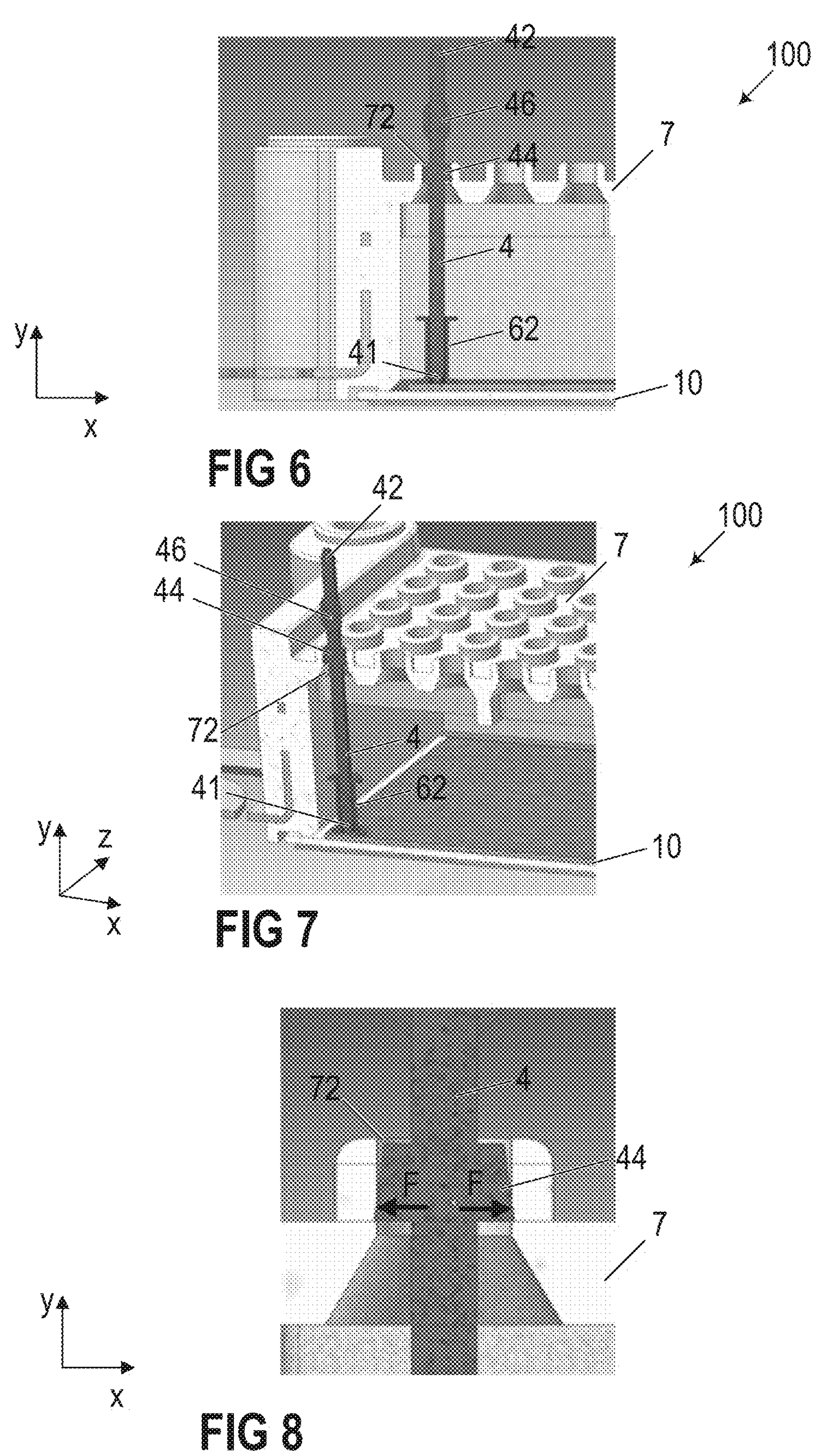
FIG. 6 is a cross-sectional view of a section of another exemplary power semiconductor module arrangement.
FIG. 7 is a three-dimensional cross-sectional view of the power semiconductor module arrangement of FIG. 6.
FIG. 8 is a cross-sectional view of a section of the power semiconductor module arrangement of FIG. 6.
Figures 9, 10, 11:
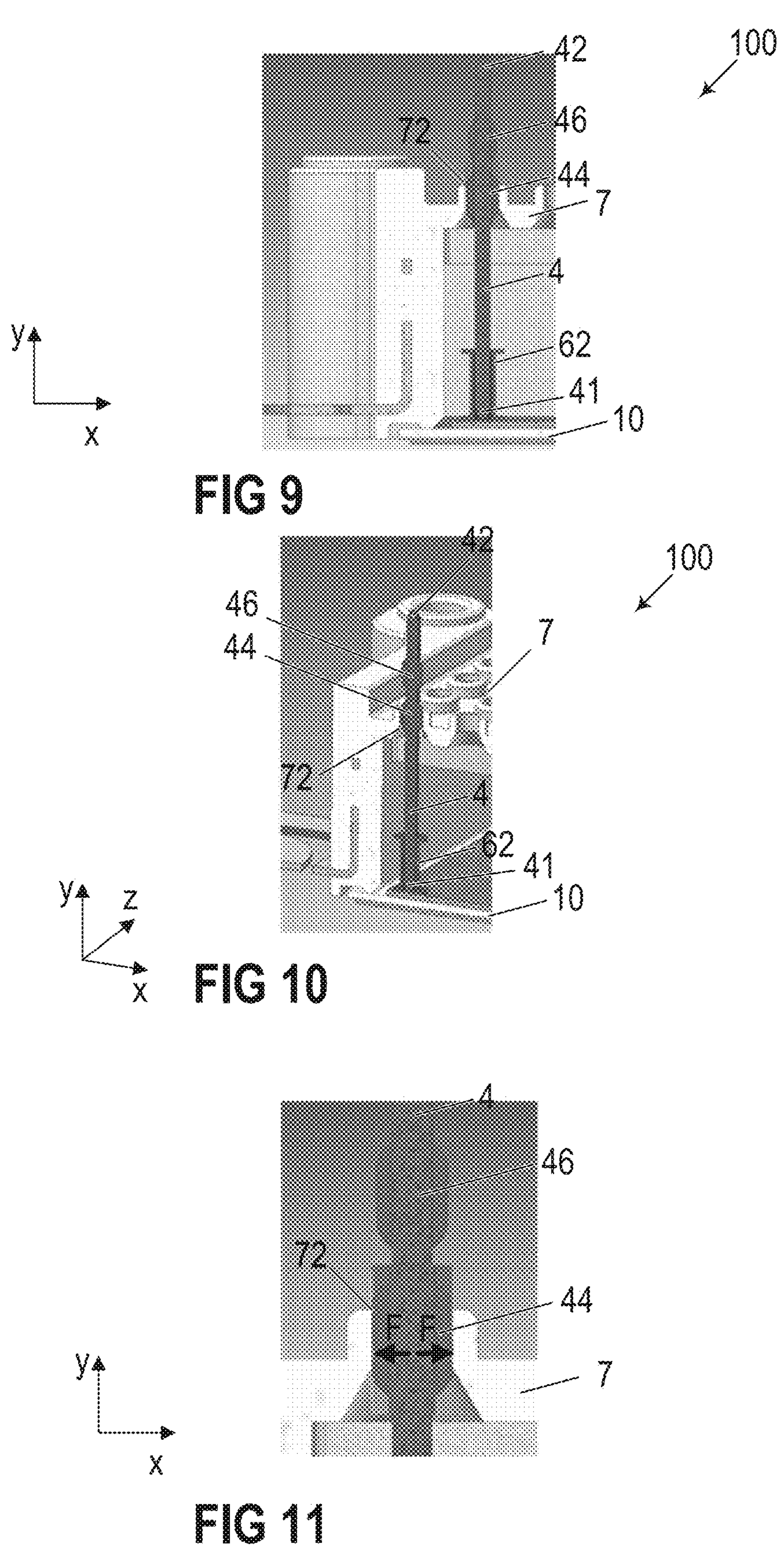
FIG. 9 is a cross-sectional view of a section of an even further exemplary power semiconductor module arrangement.
FIG. 10 is a three-dimensional cross-sectional view of the power semiconductor module arrangement of FIG. 9.
FIG. 11 is a cross-sectional view of a section of the power semiconductor module arrangement of FIG. 9.

FIGS. 6, 7 and 8 illustrate similar sections of a power semiconductor module arrangement 100 in which a terminal element 4 according to FIG. 2B is arranged, and FIGS. 9, 10 and 11 illustrate similar sections of a power semiconductor module arrangement 100 in which a terminal element 4 according to FIG. 2C is arranged. The general principle is the same for all cases. That is, the holding element 44, when inserted into one of the through holes 72, exerts a force on the housing 7 (i.e., on the inside of the respective through hole 72), thereby holding the housing 7 in a desired position with regard to the substrate 10.

Now referring to FIG. 13, a section of a power semiconductor module arrangement 100 according to an even further example is schematically illustrated. In this example, the holding element 44 is not arranged inside the through hole 72. Instead, when arranging the housing 7 on the substrate 10, the holding element 44 is pushed through the through hole 72 entirely. That is, the holding element 44, when the housing 7 is in its final position, is arranged outside of the housing 7 adjacent to the respective one of the through holes 72. The holding element 44 may be compressed when pushed through the through hole 72, similar to what has been described with respect to FIGS. 2A, 2C, 3, 4 and 5 above. When the holding element 44 emerges from the through hole 72 on the outside of the housing 7, it expands again. The holding element 44 then acts as a barrier or barbed hook. That is, the holding element 44 cannot be pushed back through the through hole 72 in the opposite direction, thereby holding the housing 7 in its desired position. In this case, therefore, a vertical force is exerted on the housing 7 towards the substrate 10, instead of a horizontal one.

Figures 14A, 14B, 14C, 15A, 15B, 15C:
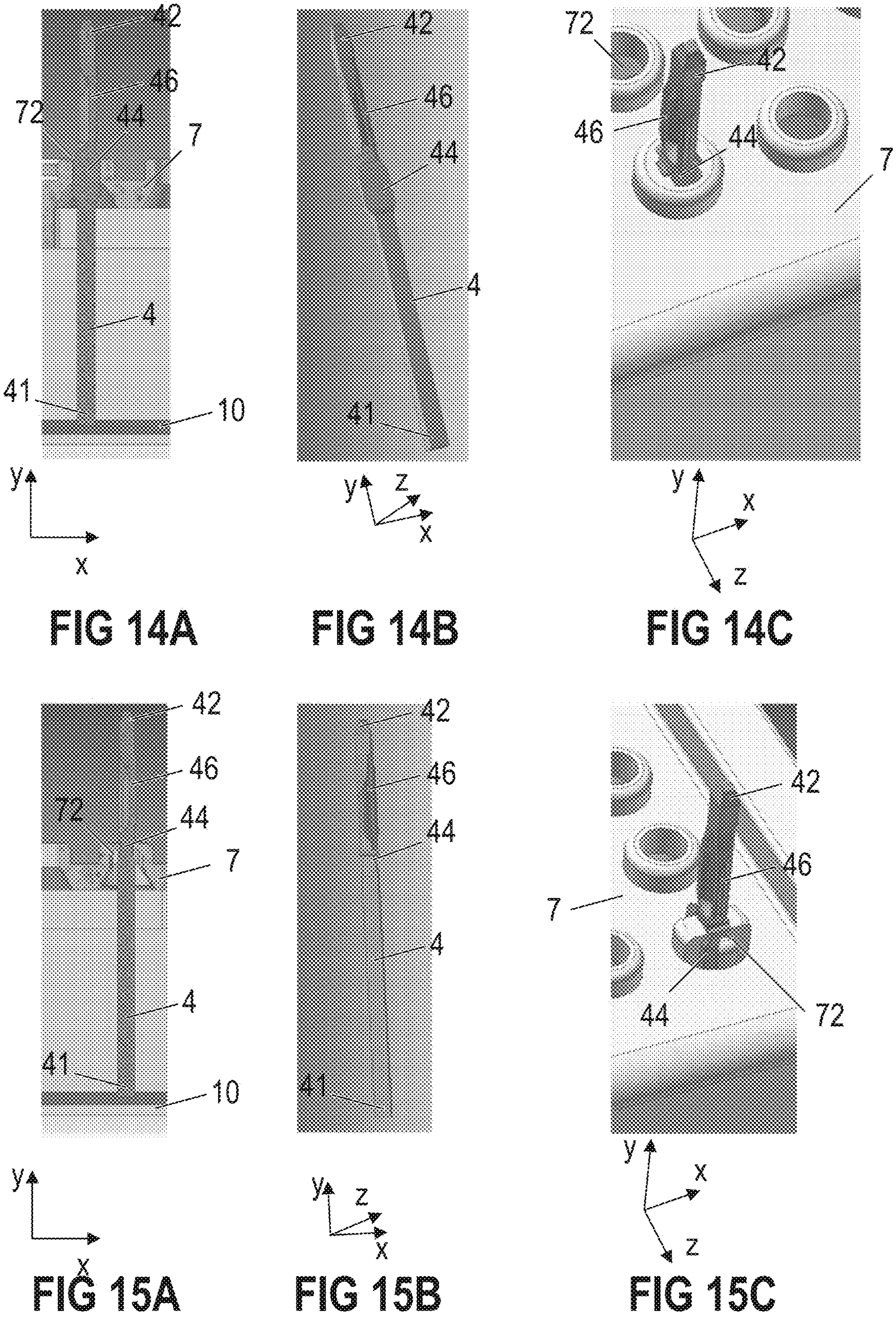
FIGS. 14A to 14C schematically illustrate different views of a power semiconductor module arrangement and a terminal element for a power semiconductor module arrangement according to embodiments of the disclosure.
FIGS. 15A to 15C schematically illustrates different views of a power semiconductor module arrangement and a terminal element for a power semiconductor module arrangement according to further embodiments of the disclosure.

Now referring to FIGS. 14A to 14C, sections of a power semiconductor module arrangement 100 and a terminal element 4 for a power semiconductor module arrangement according to an even further example are schematically illustrated. FIG. 14A schematically illustrates a cross-sectional view of a section of a respective power semiconductor module arrangement, FIG. 14B schematically illustrates a three-dimensional view of a terminal element 4 of the power semiconductor module arrangement of FIG. 14A, and FIG. 14C schematically illustrates a three-dimensional view of a section of the power semiconductor module arrangement. The holding element 44 in this example is implemented as a small plate or platelet. The general principle is similar to what has been described with respect to FIG. 2B above. The holding element 44 as illustrated in FIGS. 14A to 14C, however, does not comprise or form a barbed hook. A largest width or diameter of the holding element 44 after inserting it into a through hole 72 may equal the largest width or diameter of the holding element 44 before the insertion. A largest width or diameter of the holding element 44 in this example may be equal to or slightly larger than a diameter of the corresponding through hole 72. For example, a largest width or diameter of the holding element 44 may be between 0 and 1 mm (millimeter), or between 0 and 2 mm larger than a diameter of the corresponding through hole 72. In this way, the holding element 44 may still be inserted into the through hole 72 when applying a certain amount of force. Once inserted into the through hole 72, however, the holding element 44 may not easily be detached again.

Now referring to FIGS. 15A to 15C, sections of a power semiconductor module arrangement 100 and a terminal element 4 for a power semiconductor module arrangement according to an even further example are schematically illustrated. FIG. 15A schematically illustrates a cross-sectional view of a section of a respective power semiconductor module arrangement, FIG. 15B schematically illustrates a three-dimensional view of a terminal element 4 of the power semiconductor module arrangement of FIG. 15A, and FIG. 15C schematically illustrates a three-dimensional view of a section of the power semiconductor module arrangement. The holding element 44 in this example is implemented as a circumferential notch or indentation. That is, the holding element 44 may be formed by a section of the terminal element 4 that has a smaller diameter (or smaller largest dimensions) than the adjoining sections of the terminal element 4. In this example, the through holes 72 may comprise corresponding projections which, when the terminal element 4 is inserted in the through hole 72, engage with the notch or indentation, thereby holding the housing 7 in a desired position with regard to the substrate 10. The projections may comprise or may be formed by flexible sections which form a kind of tweezer-like element that is configured to engage with the holding element 44.

As has been described above, the arrangement of the terminal elements 4 on the substrate 10 is not restricted to specific positions. The terminal elements 4 can be arranged in any suitable position of the substrate 10. That is, they can either be arranged close to the edges of the substrate 10 or anywhere centrally on the substrate 10. The number of terminal elements 4 can depend on the number of electrical connections required to electrically contact the substrate 10. For example, the number of terminal elements 4 can depend on the number of electrical connections required between the substrate 10 and one or more external or internal printed circuit boards. The number of terminal elements 4, however, can also be chosen in order to provide sufficient mechanical stability of the housing 7. In this context it is possible that one or more of the terminal elements 4 are solely used to mechanically hold the housing 7 in its position without providing an electrical connection between the substrate 10 and any other components such as, e.g., a printed circuit board. According to one example, a power semiconductor module arrangement 100 comprises between 10 and 50, or between 10 and 30 terminal elements 4. Each of a plurality of terminal elements 4 may comprise a holding element 44, in order to provide sufficient stability of the housing 7 in its final mounting position. It is, however, also possible, that some terminal elements 4 do not comprise any holding element 44.

In the examples described above, there is only one (optional) printed circuit board 81 arranged outside the housing 7. However, it is also possible to arrange more than just one printed circuit board outside the housing 7. Two or more printed circuit boards can be arranged outside the housing either next to each other in a horizontal direction, or parallel to each other in different horizontal planes outside the housing 7. Printed circuit boards arranged in different horizontal planes can overlap completely or only partly. It is also possible to arrange one or more printed circuit boards inside the housing, similar to what has been described with respect to the external printed circuit board 81 above.

The terminal elements 4 and holding elements 44 described herein with regard to the different figures can be combined with each other in a single arrangement. That is, a power semiconductor module arrangement 100 can comprise terminal elements 4 as described with respect to FIGS. 2A and 3 to 5 and/or terminal elements 4 as described with respect to FIGS. 2B and 6 to 8, and/or terminal elements 4 as described with respect to FIGS. 2C and 9 to 11, and/or terminal elements 4 as described with respect to FIG. 13. Alternatively or additionally, a power semiconductor module arrangement 100 may comprise terminal elements 4 comprising holding elements 44 that are implemented in any other suitable way.

As used herein, the terms “having”, “containing”, “including”, “comprising” and the like are open ended terms that indicate the presence of stated elements or features, but do not preclude additional elements or features. The articles “a”, “an” and “the” are intended to include the plural as well as the singular, unless the context clearly indicates otherwise.

The expression “and/or” should be interpreted to include all possible conjunctive and disjunctive combinations, unless expressly noted otherwise. For example, the expression “A and/or B” should be interpreted to mean only A, only B, or both A and B. The expression “at least one of” should be interpreted in the same manner as “and/or”, unless expressly noted otherwise. For example, the expression “at least one of A and B” should be interpreted to mean only A, only B, or both A and B.

It is to be understood that the features of the various embodiments described herein can be combined with each other, unless specifically noted otherwise.

Although specific embodiments have been illustrated and described herein, it will be appreciated by those of ordinary skill in the art that a variety of alternate and/or equivalent implementations can be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module arrangement, comprising:

a housing comprising a plurality of through holes;

a substrate forming a ground surface of the housing; and a plurality of terminal elements mechanically and electrically connected to the substrate, wherein a first end of each of the plurality of terminal elements is arranged inside the housing and connected to the substrate, wherein each of the plurality of terminal elements extends from the substrate in a vertical direction perpendicular to a top surface of the substrate through one of the plurality of through holes to the outside of the housing, such that a second end of each of the plurality of terminal elements is arranged outside of the housing, wherein each of the plurality of terminal elements comprises a holding element arranged between the first end and the second end, wherein each of the plurality of holding elements exerts a force on the housing, thereby holding the housing in a desired position with regard to the substrate, wherein at least one of the plurality of holding elements comprises a spring element, wherein the spring element is arranged outside of the housing adjacent to one of the through holes, wherein the spring element is in an uncompressed state in which a width or diameter of the spring element is larger than a diameter of the through hole adjacent the spring element, thereby preventing the terminal element from moving vertically through the through hole and holding the housing in the desired position.

2. The power semiconductor module arrangement of claim 1, wherein the spring element comprises a press-fit element.

3. The power semiconductor module arrangement of claim 1, further comprising:

a printed circuit board arranged outside the housing essentially in parallel to and vertically above the housing, wherein the printed circuit board comprises a plurality of through holes, wherein each of the plurality of terminal elements further extends through one of the through holes of the printed circuit board.

4. The power semiconductor module arrangement of claim 1, further comprising:

a connection layer between each of the plurality of terminal elements and the substrate.

5. The power semiconductor module arrangement of claim 4, wherein the connection layer comprises at least one of:

a solder layer;

an electrically conductive adhesive;

a layer of a sintered metal powder; and a welding seam.

6. The power semiconductor module arrangement of claim 1, further comprising:

a plurality of rivets arranged on the substrate, wherein the first end of each of the plurality of terminal elements is inserted into one of the rivets.

7. The power semiconductor module arrangement of claim 1, wherein at least one of the terminal elements has a press-fit element arranged between the holding element and the second end of the terminal element.

8. A method for assembling a power semiconductor module arrangement, the method comprising:

connecting a plurality of terminal elements to a substrate; and arranging a housing comprising a plurality of through holes on the substrate, wherein each of the plurality of terminal elements extends from the substrate in a vertical direction perpendicular to a top surface of the substrate, wherein arranging the housing on the substrate comprises inserting each of the plurality of terminal elements into a different one of the plurality of through holes, such that a first end of each of the plurality of terminal elements is arranged inside the housing and connected to the substrate and a second end of each of the plurality of terminal elements is arranged outside of the housing, wherein each of the plurality of terminal elements comprises a holding element arranged between the first end and the second end, wherein after arranging the housing on the substrate, each of the plurality of holding elements exerts a force on the housing, thereby holding the housing in a desired position with regard to the substrate, wherein at least one of the plurality of holding elements comprises a spring element, wherein after the arranging, the spring element is arranged outside of the housing adjacent to one of the through holes in an uncompressed state in which a width or diameter of the spring element is larger than a diameter of the through hole adjacent the spring element, thereby preventing the terminal element from moving vertically through the through hole and holding the housing in the desired position.

9. A power semiconductor module arrangement, comprising:

a housing comprising a plurality of through holes;

a substrate forming a ground surface of the housing; and a plurality of terminal elements mechanically and electrically connected to the substrate, wherein a first end of each of the plurality of terminal elements is arranged inside the housing and connected to the substrate, wherein each of the plurality of terminal elements extends from the substrate in a vertical direction perpendicular to a top surface of the substrate through one of the plurality of through holes to the outside of the housing, such that a second end of each of the plurality of terminal elements is arranged outside of the housing, wherein each of the plurality of terminal elements comprises a holding element arranged between the first end and the second end, wherein each of the plurality of holding elements exerts a force on the housing, thereby holding the housing in a desired position with regard to the substrate, wherein at least one of the plurality of holding elements has a conical form, wherein a width or diameter of the at least one holding element having the conical form decreases from a side of the at least one holding element facing the first end of the terminal element towards an opposite side of the at least one holding element facing the second end of the terminal element, wherein a smallest width or diameter of the at least one holding element having the conical form is smaller than a diameter of the through hole, wherein a largest width or diameter of the at least one holding element having the conical form equals or is larger than a diameter of the through hole, wherein the at least one holding element is arranged inside the through hole, wherein the largest width or diameter of the at least one holding element having the conical form is larger than a width or diameter of the terminal element, such that the at least one holding element having the conical form forms a collar which acts as a barbed hook, thereby preventing the terminal element from moving vertically through the through hole and holding the housing in the desired position.

10. The power semiconductor module arrangement of claim 9, wherein at least one of the terminal elements has a press-fit element arranged between the holding element and the second end of the terminal element.

11. The power semiconductor module arrangement of claim 9, further comprising:

a printed circuit board arranged outside the housing essentially in parallel to and vertically above the housing, wherein the printed circuit board comprises a plurality of through holes, wherein each of the plurality of terminal elements further extends through one of the through holes of the printed circuit board.

12. The power semiconductor module arrangement of claim 9, further comprising:

a connection layer between each of the plurality of terminal elements and the substrate.

13. The power semiconductor module arrangement of claim 12, wherein the connection layer comprises at least one of:

a solder layer;

an electrically conductive adhesive;

a layer of a sintered metal powder; and a welding seam.

14. The power semiconductor module arrangement of claim 9, further comprising:

a plurality of rivets arranged on the substrate, wherein the first end of each of the plurality of terminal elements is inserted into one of the rivets.

* * * * *